United States Patent [19]
Takahashi et al.

[11] Patent Number: 6,105,495
[45] Date of Patent: Aug. 22, 2000

[54] SCREEN PRINTING APPARATUS AND SCREEN PRINTING METHOD

[75] Inventors: Ken Takahashi, Yamanashi; Syoji Sato, Neyagawa; Hiroaki Onishi, Higashiosaka; Koji Mitsushiro; Takao Naito, both of Yamanashi, all of Japan

[73] Assignee: Matsushita Electric Industrial Co., Ltd., Japan

[21] Appl. No.: 09/180,443

[22] PCT Filed: May 26, 1997

[86] PCT No.: PCT/JP97/01782

§ 371 Date: Nov. 6, 1998

§ 102(e) Date: Nov. 6, 1998

[87] PCT Pub. No.: WO97/45264

PCT Pub. Date: Dec. 4, 1997

[30] Foreign Application Priority Data

May 28, 1996 [JP] Japan .................................. 8-132912

[51] Int. Cl.⁷ .................................................. B41F 15/46
[52] U.S. Cl. ............................................. 101/123; 101/129
[58] Field of Search .................................. 101/114, 120, 101/123, 124, 129

[56] References Cited

U.S. PATENT DOCUMENTS

| | | | |
|---|---|---|---|
| 4,372,203 | 2/1983 | Brasa | 101/124 |
| 4,995,316 | 2/1991 | Kolblin et al. | 101/123 |
| 5,152,219 | 10/1992 | Adachi et al. | 101/123 |
| 5,189,950 | 3/1993 | Eppinger | 101/123 |
| 5,440,980 | 8/1995 | Murakami et al. | 101/123 |
| 5,479,854 | 1/1996 | Chikahisa et al. | 101/123 |
| 5,865,117 | 2/1999 | Asai et al. | 101/123 |
| 5,893,325 | 4/1999 | Sakai | 101/123 |

FOREIGN PATENT DOCUMENTS

| | | | |
|---|---|---|---|
| 423428 | 4/1991 | European Pat. Off. | 101/123 |
| 0 1 262 694 | 10/1989 | Japan . | |
| 107147 | 4/1992 | Japan | 101/123 |
| 2054461 | 2/1981 | United Kingdom | 101/124 |
| 2 057 357 | 4/1981 | United Kingdom . | |

*Primary Examiner*—Stephen R. Funk
*Attorney, Agent, or Firm*—Parkhurst & Wendel, L.L.P.

[57] ABSTRACT

In a screen printing apparatus and method for using a squeegee to press printing paste on a screen while moving the squeegee in the horizontal direction in order to apply the paste to a circuit board for printing, accurate printing with excellent printed shapes is provided by allowing the squeegee to flexibly fit the circuit regardless of its slope, swell, or warp to achieve balanced printing at a low specified pressure. To accomplish this, squeegees (26a and 26b) are elevated by an air cylinder (27) that can be rotated at the longitudinal center of the squeegees (26a and 26b) and that cancels their weight, and are then pressed downward by air cylinders (35 and 36) located symmetrically about the center in order to press the top surface of a screen (23).

8 Claims, 9 Drawing Sheets

SCREEN PRINTING APPARATUS AND SCREEN PRINTING METHOD

TECHNICAL FIELD

The present invention relates to a screen printing apparatus and method for executing screen printing by applying printing paste such as cream solder to a circuit board such as a printed circuit board on which an electronic circuit is formed, through a screen having opening holes formed in a printed pattern.

BACKGROUND ART

In recent years, screen printing apparatuses and methods have been used for a cream solder printing process in a circuit mounting process for electronic components. The reduced size and weight of electronics and their improved functions, however, further urge the reduction of the size of electronic-components-mounted circuit boards and the improvement of their accuracy, thereby requiring very accurate printing. Thus, the use of both contact printing and snap-off-speed-controlled printing has become popular.

Contact printing eliminates the gap between a screen and a circuit board in order to minimize the distortion of the screen due to the gap. Snap-off-speed-controlled printing controls the snap-off speed to a low value (in recent years, a common value has been 1 mm/sec.) in order to stabilize printed that is, to minimize the disruption of printed shapes occurring when the screen is pulled due to the viscosity and adhesion of cream solder filled in the opening holes in the screen when the screen is released from the circuit board. Furthermore, in recent years, low-pressure printing is gathering the industry's attention and various attempts are being made to improve this technique. This printing method minimizes the spreading of cream solder to the rear surface of the screen caused by an unnecessarily high printing pressure (a pressure effected when squeegees press the screen) and misalignment caused when the squeegees pull the screen during printing.

An example of low-pressure printing is the screen printing apparatus described in Japanese Patent Application Laid-Open No. 7-205397.

An example of low-pressure printing in a conventional screen printing apparatus and method is generally described below with reference to the drawings.

Figure 9:
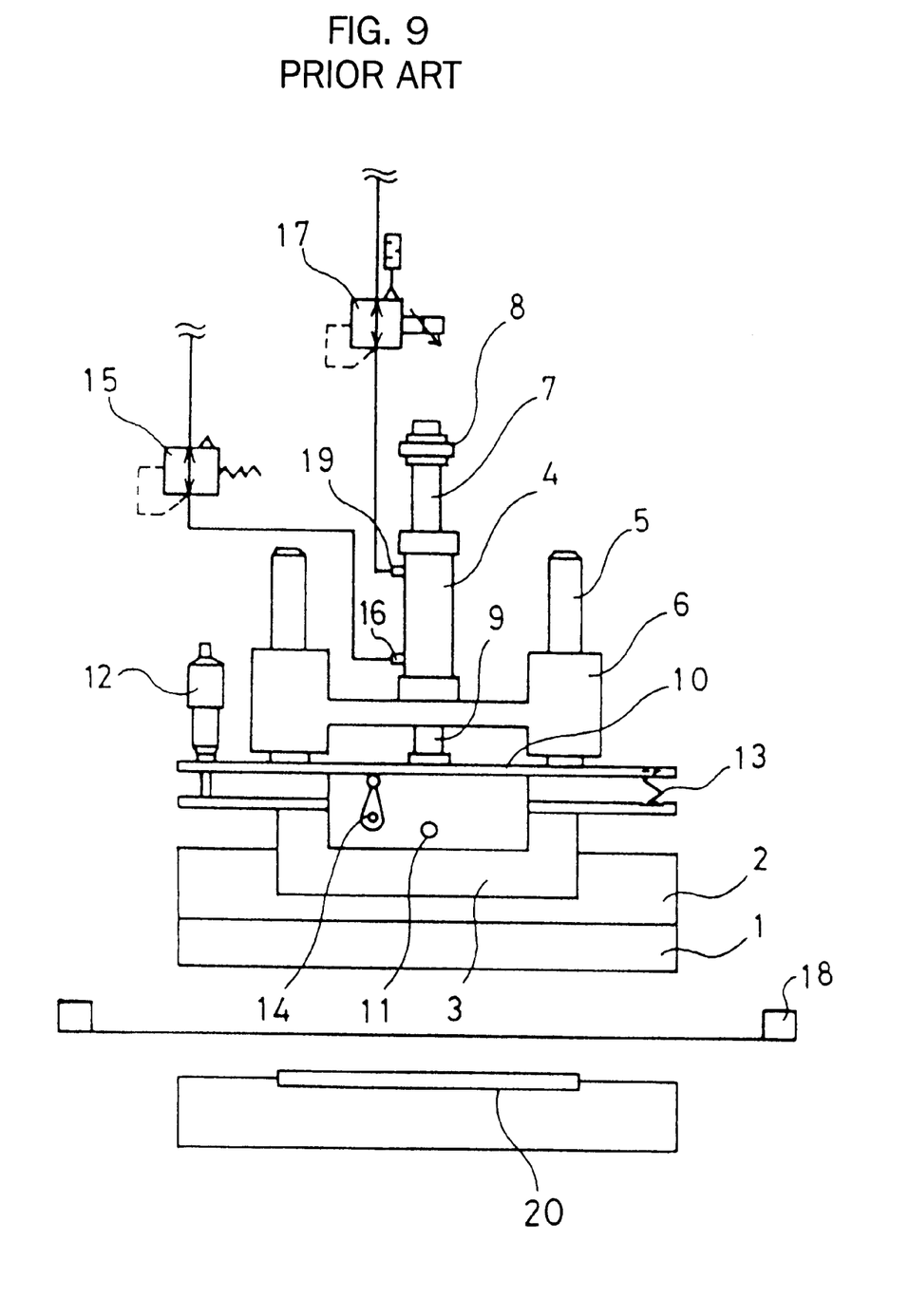
FIG. 9 is a schematic front view and pneumatic circuit diagram of a low-pressure print head section in a conventional screen printing apparatus and method.

FIG. 9 shows a schematic front view generally describing a low-pressure printing head section in a general conventional screen printing apparatus and method and also schematically shows a circuit diagram of part of a pneumatic circuit in the low-pressure printing head section.

In FIG. 9, 1 is a squeegee, 2 is a squeegee holder for gripping and holding the squeegee 1, 3 is a holder for holding the squeegee holder 2, 4 is an air cylinder for both rods that elevatorily drives the squeegee 1, 5 is an elevating guide used to elevatorily drive the squeegee 1, 6 is a slide bearing for the elevating guide 5, 7 is an upper piston rod of the air cylinder 4, 8 is a stopper for adjusting the elevating stroke of the air cylinder 4, 9 is a lower piston rod of the air cylinder 4, 10 is a base block secured to the tip of the lower piston rod 9, and 11 is a rotation-supporting shaft secured to the base block 10.

The holder 3 is fitted on the base block 10 in such a manner that it can be rotationally oscillated using the rotation-supporting shaft 11.

Reference numeral 12 designates a micrometer head secured to the base block 10 wherein the amount of the protrusion of its tip can be adjusted so that the tip abuts the holder 3. Reference numeral 13 denotes a spring mounted between the base block 10 and the holder 3, and the micrometer head 12 and the spring 13 are located at approximately symmetrical positions about the rotation-supporting shaft 11. Reference numeral 14 indicates a clamp lever that fixes the rotational oscillation of the holder 3.

Reference numeral 15 designates a manual regulator that transmits to a lower port 16 in the air cylinder 4 the pressure of air passing the regulator 15 when the squeegee 1 is elevated. The air pressure must be manually adjusted in advance using the manual regulator 15 so as to account for the weight of the squeegee 1 and associated components operating in response to the squeegee 1 as well as the resistance effected during elevation and lowering.

Reference numeral 17 denotes an electropneumatic regulator that transmits to an upper port 19 in the air cylinder 4, a total air pressure including the minimum force required to push down the squeegee 1 elevated due to the air pressure adjusted by the manual regulator 15 and an additional air pressure required to push the squeegee down to the screen 18, when the squeegee 1 is lowered.

The parallelism between the screen 18 and the squeegee 1 is visually adjusted using the micrometer head 12.

This configuration enables printing on the screen 18 and the circuit board 20 at a low pressure at which the force equal to the weight of the squeegee 1 and associated components operating in response to the squeegee 1 cancels the force for pressing the squeegee onto the screen 18.

The above configuration, however, has the following five problems, so it cannot meet the request for accurate printing that can be achieved by improving the operability, setting accuracy, and reproducibility during the setting of printing conditions.

(Problem 1)

Since the micrometer head 12 abuts the supported portion of the squeegee 1, printing fails to flexibly fit the slope, swell, and warp of the circuit board 20 in the printing direction or the direction perpendicular thereto, resulting in unbalanced and thus inaccurate printing (printed shapes and volume).

(Problem 2)

The variation of squeegees 1 occurring during manufacturing causes misalignment between the center of the squeegee 1 and its center of gravity to cause the squeegee 1 to be tilted to one side around the rotation-supporting shaft 11, resulting in different printing pressures around the rotation-supporting shaft 11.

(Problem 3)

A squeegee 1 the length of which corresponds to the size of the circuit board is used at the production site, and the weight of the squeegee depends on its length or material, so the air pressure from the manual regulator 15 must be adjusted as required. Likewise, the air pressure from the electropneumatic regulator 17 must be changed to re-adjust the total pressure.

Furthermore, since the weight of the squeegee 1 is unknown, adjustments are required based on the results of eye estimations or measurements conducted by a separate measuring device. Consequently, unwanted arrangement time is required and the operability, setting accuracy, and reproducibility are degraded.

To alleviate this problem, the maximum weight of a mountable squeegee 1 can be assumed to adjust the air pressure from the manual regulator 15 in advance in order to eliminate the needs for the operation of adjusting the air pressure from the manual regulator 15 during operation. This, however, cannot obviate the needs for the unwanted arrangements for identifying the weight canceling pressure.
(Problem 4)

Since the parallelism between the screen 18 and the squeegee 1 is visually adjusted using the micrometer head 12, it varies with the operator, thereby degrading the setting accuracy and reproducibility.

A different conventional example (not shown) removes the micrometer head 12 and the spring 13 to provide a rotatable configuration. This configuration obviates the needs for the parallelism adjustments in contrast to the locked configuration. If, however, the center of the printing pattern on the screen 18 is offset from the center of the screen 18, the longitudinal center of the squeegee 1 must be almost aligned with the center of the circuit board 20 in order to improve stability required to maintain the parallelism.
(Problem 5)

When the screen 18 is released from the circuit board 20, printing is executed with the squeegee 1 pressing the screen 18, so the screen 18 may be bent (because the screen 18 is pressed until the air cylinder 4 reaches the end of its lowering stroke) to disrupt printed shapes, thereby degrading the printing accuracy.

It is an object of this invention to solve Problems 1 to 5 shown above.
(Object 1)

It is an object of this invention to achieve balanced printing at a low specified pressure by flexibly fitting the squeegee along the circuit board regardless of its slope, swell, or warp.
(Object 2)

It is an object of this invention to achieve balanced printing at a specified pressure without tilting the squeegee regardless of the position of its center of gravity.
(Object 3)

It is an object of this invention to enable low-pressure printing that cancels the weight of the squeegee in order to minimize the spreading of cream solder to the rear surface of the screen and misalignment caused when the squeegee pulls the screen during printing, and to eliminate an unwanted arrangement operation performed by a skilled operator to determine the weight canceling pressure in order to account for the variation of the weight of the squeegee depending on its length or material, thereby improving the operability, setting accuracy, and reproducibility during the setting of printing conditions.
(Object 4)

It is an object of this invention to automatically control the adjustment of the parallelism between the screen and the squeegee that is otherwise carried out by a skilled operator, thereby improving the operability, setting accuracy, and reproducibility during the setting of printing conditions.
(Object 5)

It is an object of this invention to achieve acceptable printing by minimizing the bending of the screen caused during a snapping-off operation of releasing the screen from the circuit board.

DISCLOSURE OF THE INVENTION

To accomplish these objects, this invention provides a screen printing apparatus comprising a screen in which opening holes are formed that constitute a printing pattern; a squeegee that can be rotationally oscillated in the vertical direction around a specified position such as the longitudinal center and that can be contacted with and pressed into the screen; and a horizontal movement means for moving the squeegee in an approximately horizontal direction relative to the screen, the squeegee being contacted with and pressed into the screen and moved in the horizontal direction while printing paste on the screen is applied to a circuit board through the opening holes in the screen for printing, wherein the apparatus includes a specified-pressure floating control means operative when the printing paste on the screen is printed and applied, for applying a force sufficient to cancel the weight of the squeegee in the elevating direction to elevate the squeegee, and then applying a force to the squeegee to push it down in the lowering direction from the respective longitudinal sides of the above rotational center to contact it with the screen in such a way that it can be pressed into the screen, and operative when the squeegee is moved in an approximately horizontal direction relative to the screen, for rotationally oscillating, elevating, and lowering the squeegee in such a way that the squeegee fits the slope, swell, and warp of the circuit board present in the approximately horizontal movement direction and length direction of the squeegee, the squeegee pressing the screen into the circuit board while effecting a specified pressure.

In addition, to achieve these objects, this invention provides a screen printing method for contacting and pressing a squeegee that can be rotationally moved within a vertical plane around a specified position such as the longitudinal center, with and into a screen in which opening holes are formed in a printing pattern, and moving the squeegee in the horizontal direction to apply printing paste on the screen to a circuit board through the opening holes in the screen for printing, wherein:

when the squeegee is moved in an approximately horizontal direction relative to the screen to fill the printing paste in the opening holes in the screen arranged in a printing pattern, the method applies a force sufficient to cancel the weight of the squeegee in the elevating direction to elevate the squeegee, and then applies a force to the squeegee to push it down in the lowering direction from the respective longitudinal sides of the above rotational center to contact it with the screen in such a way that it can be pressed into the screen, and when the squeegee is moved in an approximately horizontal direction relative to the screen, the method rotationally oscillates, elevates, and lowers the squeegee in such a way that the squeegee fits the slope, swell, and warp of the circuit board present in the approximately horizontal movement direction and length direction of the squeegee, the squeegee pressing the screen into the circuit board while effecting a specified pressure, and wherein:

after the printing paste has been filled in the opening holes in the screen arranged in a printing pattern, this method, before releasing the circuit board from the screen, fixes the squeegee in such a way that it will not operate in the rotational oscillating direction or elevating direction and after fixture, elevates the squeegee up to a position at which the amount of pressing-in of the squeegee relative to the screen surface is zero, that is, the tip of the squeegee barely contacts the screen surface.

In this configuration, by pressing the squeegee from both sides thereof while canceling its weight, the squeegee can be pressed at a low specified pressure in a balanced manner to enable the squeegee to be fitted along the screen or the circuit board regardless of the slope, swell, or warp of the circuit board, thereby enabling balanced printing at a low specified pressure while precluding the squeegee from tilting independently of the position of its center of gravity.

In addition, low-pressure printing that cancels the weight of the squeegee can be achieved, thereby minimizing the spreading of cream solder to the rear surface of the screen and misalignment caused when the squeegee pulls the screen during printing.

Furthermore, the bending of the screen can be minimized that is caused during a snapping-off operation of releasing the screen from the circuit board, thereby restraining the disruption of printed shapes and the degradation of the printing accuracy.

In summary, the configuration shown above can improve the operability, setting accuracy, and reproducibility during the setting of printing conditions and achieve accurate printing.

The invention for a first screen printing apparatus provides:

a screen printing apparatus comprising a screen in which opening holes are formed that constitute a printing pattern; a squeegee that can be rotationally oscillated in the vertical direction around a specified position such as the longitudinal center and that can be contacted with and pressed into the screen; and a horizontal movement means for moving the squeegee in an approximately horizontal direction relative to the screen, the squeegee being contacted with and pressed into the screen and moved in the horizontal direction while printing paste on the screen is applied to a circuit board through the opening holes in the screen for printing, wherein:

the apparatus includes a specified-pressure floating control means operative when the printing paste on the screen is printed and applied, for applying a force sufficient to cancel the weight of the squeegee in the elevating direction to elevate the squeegee, and then applying a force to the squeegee to push it down in the lowering direction from both sides of it that are approximately longitudinally symmetrical about its rotational center to contact it with the screen in such a way that it can be pressed into the screen, and operative when the squeegee is moved in an approximately horizontal direction relative to the screen, for rotationally oscillating, elevating, and lowering the squeegee in such a way that the squeegee fits the slope, swell, and warp of the circuit board present in the approximately horizontal movement direction and length direction of the squeegee, the squeegee pressing the screen into the circuit board while effecting a specified pressure.

This specified-pressure floating control means cancels the weight of the squeegee to enable the squeegee to be pressed into the screen from both ends of it that are symmetrical about its rotational center in such a way that it flexibly fits the screen independently of the slope, swell, and warp of the circuit board, and also enables the squeegee to be held so as not to incline regardless of the position of its center of gravity, thereby allowing it to be pressed at a low specified pressure in a balanced manner.

The invention for a first screen printing method provides:

a screen printing method for contacting and pressing a squeegee that can be rotationally moved within a vertical plane around a specified position such as the longitudinal center, with and into a screen in which opening holes are formed in a printing pattern, and moving the squeegee in the horizontal direction to apply printing paste on the screen to a circuit board through the opening holes in the screen for printing, wherein:

when the squeegee is moved in an approximately horizontal direction relative to the screen to fill the printing paste in the opening holes in the screen arranged in a printing pattern, the method applies a force sufficient to cancel the weight of the squeegee in the elevating direction to elevate the squeegee, and then applies a force to the squeegee to push it down in the lowering direction from the respective longitudinal sides of the above rotational center to contact it with the screen in such a way that it can be pressed into the screen, and when the squeegee is moved in an approximately horizontal direction relative to the screen, the method rotationally oscillates, elevates, and lowers the squeegee in such a way that the squeegee fits the slope, swell, and warp of the circuit board present in the approximately horizontal movement direction and length direction of the squeegee, the squeegee pressing the screen into the circuit board while effecting a specified pressure, and wherein:

after the printing paste has been filled in the opening holes in the screen arranged in a printing pattern, the method, before releasing the circuit board from the screen, fixes the squeegee in such a way that it will not operate in the rotational oscillating direction or elevating direction and after fixture, elevates the squeegee up to a position at which the amount of pressing-in of the squeegee relative to the screen surface is zero.

This method cancels the weight of the squeegee to enable the squeegee to be pressed into the screen from both ends of it that are symmetrical about its rotational center in such a way that it flexibly fits the screen independently of the slope, swell, or warp of the circuit board, and also enables the squeegee to be held so as not to incline regardless of the position of its center of gravity, thereby allowing it to be pressed at a low specified pressure in a balanced manner. This method can also minimize the bending of the screen caused when the screen is released from the circuit board.

The invention for a second screen printing apparatus provides:

a screen printing apparatus comprising a screen in which opening holes are formed that constitute a printing pattern; a squeegee that can be rotationally oscillated in the vertical direction around a specified position such as the longitudinal center and that can be contacted with and pressed into the screen; and a horizontal movement means for moving the squeegee in an approximately horizontal direction relative to the screen, the squeegee being contacted with and pressed into the screen and moved in the horizontal direction while printing paste on the screen is applied to a circuit board through the opening holes in the screen for printing, wherein:

the apparatus includes a press-in means for applying a force sufficient to press the squeegee down in the lowering direction from both sides of it that are approximately longitudinally symmetrical about its rotational center, the squeegee having been elevated by a force applied in the elevating direction to cancel the weight of the squeegee, the press-in means thus contacting and pressing the squeegee with and into the screen; and a holding means operative after the press-in means has pressed the squeegee into the screen and before the squeegee is moved in an approximately horizontal direction relative to the screen, for holding the squeegee in such a way that it will not operate in the rotational oscillating direction or elevating direction.

The press-in means cancels the weight of the squeegee while enabling the squeegee to be pressed into the screen from both ends of it that are symmetrical about its rotational center in such a way that it flexibly fits the screen independently of the slope, swell, or warp of the circuit board, and also enables the squeegee to be held so as not to incline regardless of the position of its center of gravity, thereby allowing it to be pressed at a low specified pressure in a balanced manner. In addition, the holding means can prevent an unbalanced printing pressure resulting from the sinking and floating of the squeegee caused by the rolling force of the printing paste during horizontal movement.

The invention for a third screen printing apparatus provides:

a screen printing apparatus comprising a screen in which opening holes are formed that constitute a printing pattern; a squeegee that can be rotationally oscillated in the vertical direction around a specified position such as the longitudinal center and that can be contacted with and pressed into the screen; and a horizontal movement means for moving the squeegee in an approximately horizontal direction relative to the screen, the squeegee being contacted with and pressed into the screen and moved in the horizontal direction while printing paste on the screen is applied to a circuit board through the opening holes in the screen for printing, wherein:

the apparatus includes an elevation drive means for controlling a squeegee weight canceling force which can elevate and lower the squeegee in the vertical direction relative to the screen and which has a weight canceling force control means for elevating the squeegee using a weight canceling force including the weight of the squeegee and components operating with the squeegee;

a rotation supporting section provided at the tip of the elevation drive means for controlling a squeegee weight canceling force to support the squeegee at a specified longitudinal position in such a way that the squeegee can be rotationally oscillated;

a pair of elevation drive means for controlling a squeegee-pressing force which applies a downward force to both sides of the squeegee that are approximately longitudinally symmetrical about its rotational center supported by the rotation supporting section in order to lower the squeegee, which has been elevated by the elevation drive means for controlling a squeegee weight canceling force, the elevation drive means having a control means for arbitrarily automatically controlling the pressing force of the squeegee applied to the screen and the circuit board;

a holding means for positioning and holding at an arbitrary position the squeegee elevated by the elevation drive means for controlling a squeegee-pressing force and the elevation drive means for controlling a squeegee weight canceling force; and a squeegee head elevation drive means capable of elevating and lowering the squeegee in the vertical direction relative to the screen using all of the elevation drive means for controlling a squeegee-pressing force, the elevation drive means for controlling a squeegee weight canceling force, the holding means, and the rotation supporting section.

This configuration cancels the weight of the squeegee to enable the squeegee to be pressed into the screen from both ends of it that are symmetrical about its rotational center in such a way that it flexibly fits the screen independently of the slope, swell, or warp of the circuit board, and also enables the squeegee to be held so as not to incline regardless of the position of its center of gravity, thereby allowing it to be pressed at a low specified pressure in a balanced manner.

In addition, the holding means can prevent an unbalanced printing pressure resulting from the sinking and floating of the squeegee caused by the rolling force of the printing paste during horizontal movement, and can minimize the bending of the screen caused when the screen is released from the circuit board.

In the third screen printing apparatus, the elevation drive means for controlling a squeegee weight canceling force includes a weight measuring means for automatically measuring the weight of the squeegee, the weight measuring means gradually increasing the air pressure from a regulator and measuring the air pressure as an automatically measured value when the squeegee has been elevated up to the upper limit position of the elevation drive means for controlling a squeegee weight canceling force.

This configuration enables the automatic measurement of the weight of the squeegee that varies depending on its length or material, thereby improving the operability, setting accuracy, and reproducibility during the setting of printing conditions.

Furthermore, the third screen printing apparatus includes:

a pair of detection means for detecting as the position of a squeegee press-in origin a position at which the squeegee is abutted on the top surface of the screen in a balanced manner, wherein when the squeegee is elevated by the elevation drive means for controlling a squeegee weight canceling force, lowered by the pair of elevation drive means for controlling a squeegee-pressing force, and then gradually lowered by the squeegee head elevation drive means in such a way as to fit the screen around the rotation supporting section in a balanced manner, followed by elevation due to the reaction forcus from the screen, then the origin detection means detects as the position of the squeegee press-in origin the position of the squeegee when the pair of elevation drive means for controlling a squeegee-pressing force has elevated the same distance from its lower limit position as the squeegee.

This configuration can automate operations of adjusting the parallelism between the screen and the squeegee and determining the position of the press-in origin at which the squeegee contacts the screen, thereby improving the operability, setting accuracy, and reproducibility during the setting of printing conditions.

The invention for a second screen printing method provides:

a screen printing method for contacting and pressing a squeegee that can be rotationally moved within a vertical plane around a specified position such as the longitudinal center, with and into a screen in which opening holes are formed in a printing pattern, and moving the squeegee in the horizontal direction to apply printing paste on the screen to a circuit board through the opening holes in the screen for printing, comprising:

an automatic measuring step for automatically measuring the weight of the squeegee and components moving with the squeegee;

an elevating step operative after the automatic measuring step for elevating the squeegee using the automatically measured weight;

a press-in step operative after the elevating step for applying an arbitrary pressing force to the squeegee from both sides of it that are approximately symmetrical about its rotational center to lower and press it against the screen or the circuit board; and a squeegee press-in origin position detection step operative after the press-in step for determining as the position of the squeegee press-in origin the position of the squeegee obtained when the squeegee has been elevated a distance corresponding to an arbitrarily set elevation, due to the reaction force from the screen or the circuit board.

This method can automatically measure the weight of the squeegee that varies depending on its length or material and can automate the adjustment of the parallelism between the screen and the squeegee to improve the operability, setting accuracy, and reproducibility during the setting of printing conditions. It also cancels the weight of the squeegee to enable the squeegee to be pressed into the screen from both ends of it that are symmetrical about its rotational center in such a way that it flexibly fits the screen independently of the slope, swell, or warp of the circuit board, and enables the squeegee to be held so as not to incline regardless of the position of its center of gravity, thereby allowing it to be pressed at a low specified pressure in a balanced manner.

BEST MODE FOR CARRYING OUT THE INVENTION

In FIGS. 1 to 3, 21 is a print head section having a specified-pressure floating control means, 22 is printing paste, 23 is a screen, 24 is a circuit board, and 25 is a stage on which the circuit board 24 is positioned and fixed and which can be elevated to and lowered from the bottom surface of the screen 23.

Figure 1:
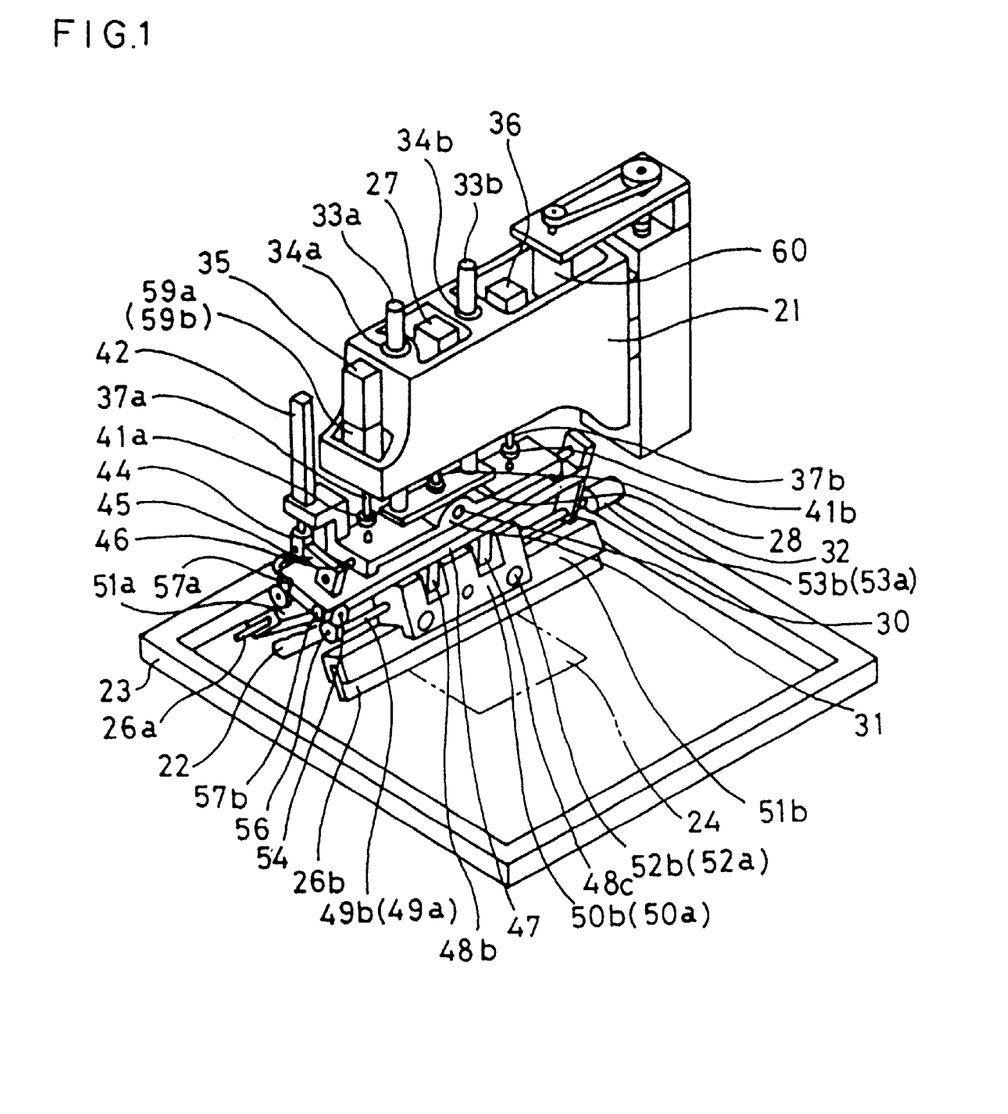
FIG. 1 is a schematic perspective view of a print head section in a screen printing apparatus and method according to an embodiment of this invention.
Figure 2:
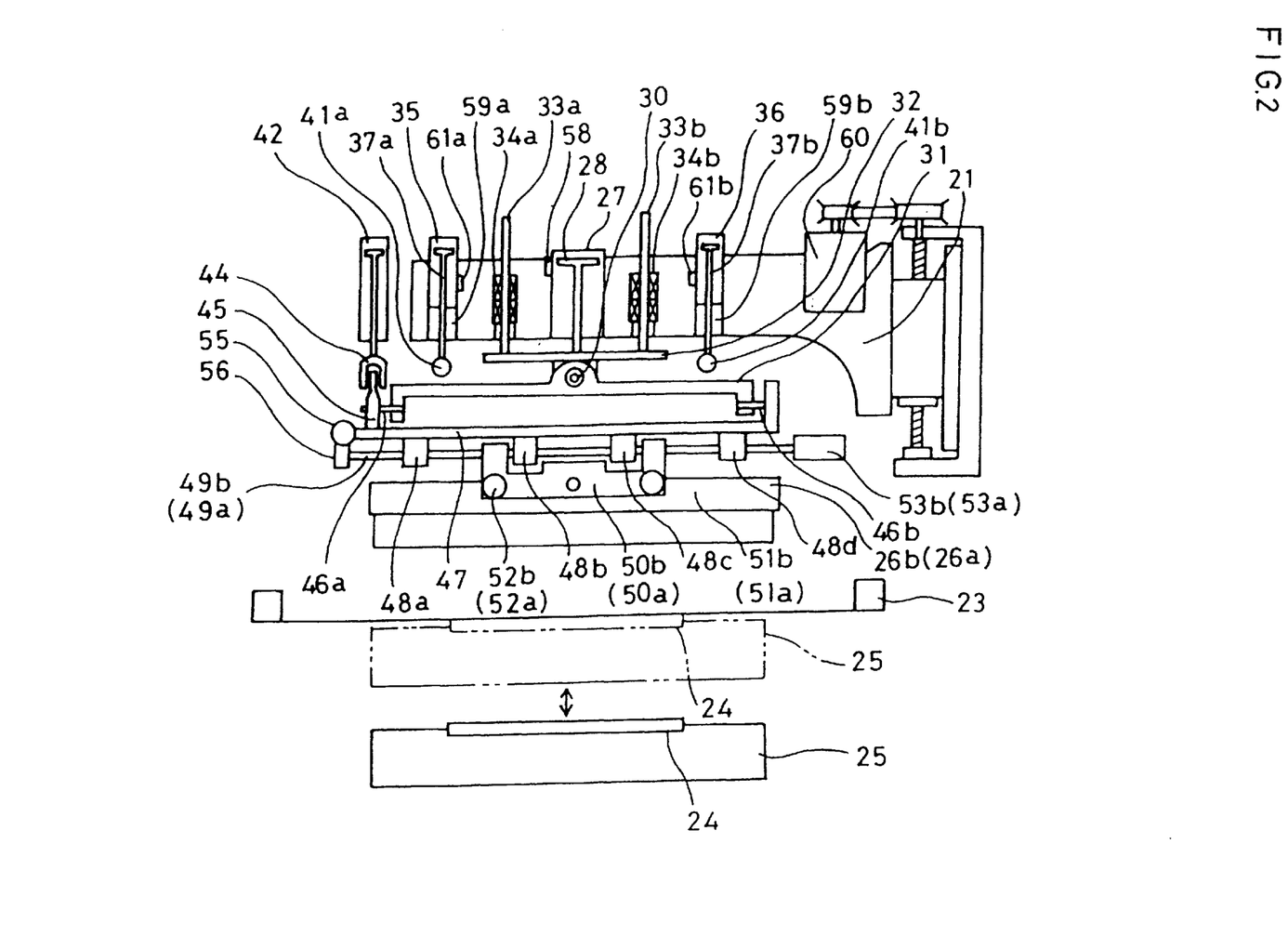
FIG. 2 is a schematic right side view of the print head section.
Figure 3:
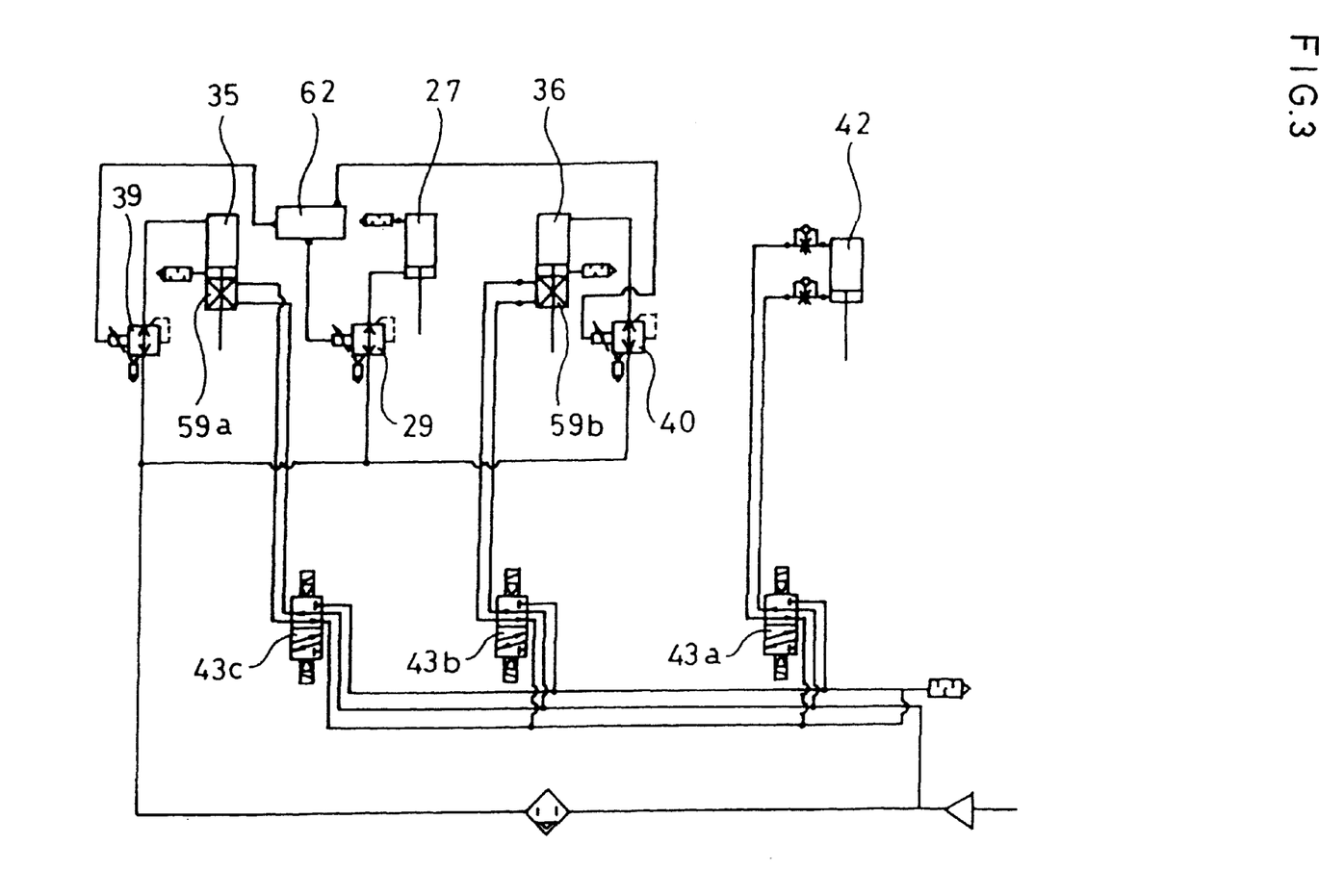
FIG. 3 is a schematic pneumatic circuit diagram of the print head section.

The print head section 21 having the specified-pressure floating control means is composed of the following components.

Reference numeral 26a designates a left printing squeegee, and reference numeral 26b denotes a right printing squeegee. The squeegees are generally composed of urethane rubber. The hardness of urethane rubber is, for example, between Hs60 and Hs100.

Reference numeral 27 is an air cylinder operating as an elevation drive means for controlling a squeegee weight canceling force, and 28 is a piston rod in the air cylinder 27. The air cylinder 27 is mounted in such a way as to face in the lowering direction so that the tip of the piston rod 28 faces downward.

Reference numeral 29 denotes an electropneumatic regulator operating as a means for controlling a weight canceling force and that supplies an air pressure P to the air cylinder 27 so that the piston rod 28 operates in the elevating direction.

Reference numeral 30 denotes a bearing operating as a rotation supporting section, attached to the tip of the piston rod 28, and disposed at the longitudinal center between the left printing squeegee 26a and the right printing squeegee 26b. Reference numeral 31 indicates a rotor that is supported by the bearing 30 in such a manner as to rotationally move around its horizontal axis. Reference numeral 32 designates a bearing support that supports the bearing 30.

Reference numerals 33a and 33b denote elevating guide shafts attached to the bearing support 32. The elevating guide shafts 33a and 33b receive radial loads when the piston rod 28 is elevated or lowered by an air pressure supplied by the electropneumatic regulator 29. Reference numerals 34a and 34b indicate slide bearings receiving the elevating guide shafts 33a and 33b.

Reference numerals 35 and 36 designate front and rear air cylinders each operating as an elevation drive means for controlling a squeegee-pressing force. The air cylinders 35 and 36 are attached to the respective ends of the bearing 30 in such a way as to be approximately symmetrical.

Reference numerals 37a and 37b denote piston rods in the air cylinders 35 and 36. The air cylinders 35 and 36 are mounted in such a way as to face in the lowering direction so that the tips of the piston rods 37a and 37b face downward.

Reference numerals 39 and 40 denote front and rear electropneumatic regulators operating as control means for arbitrarily automatically controlling the pressing force effected on the screen 23 and the circuit board 24 through the left and right squeegees 26a and 26b. The electropneumatic regulators 39 and 40 nearly simultaneously supply air pressures to the air cylinders 35 and 36 so that the piston rods 37a and 37b operate in the lowering direction.

Reference numerals 41a and 41b denote pressing bodies attached to the tips of the piston rods 37a and 37b. When the piston rods 28, 37a, and 37b are located at their upper limit positions, there is a small gap between the pressing bodies 41a and 41b and the rotor 31. When air pressures are supplied to the air cylinders 35 and 36, the pressing bodies lower together with the piston rods 37a and 37b.

When the piston rods 37a and 37b lower to cause the pressing bodies 41a and 41b to press the rotor 31, the piston rod 28 lowers.

If different pressures are supplied to the air cylinders 35 and 36, one of the pressing bodies 41a and 41b that is affected by the higher air pressure acts to tilt the rotor 31, thereby enabling the pressing force (printing pressure) effected on the screen 23 and the circuit board 24 through the squeegees 26a and 26b to be arbitrarily varied symmetrically about the bearing 30.

The air pressure from the electropneumatic regulator 39 acts as the front pressing force on the left and right squeegees 26a and 26b, whereas the air pressure from the electropneumatic regulator 40 acts as the rear pressing force on the left and right squeegees 26a and 26b.

The front air pressure on the left squeegee 26a is referred to as PF(L), the rear air pressure on the left squeegee is referred to as PR(L), the front air pressure on the right squeegee 26b is referred to as PF(R), and the rear air pressure on the left squeegee is referred to as PR(R).

Reference numeral 42 designates an air cylinder operating as a squeegee-switching drive means, and 43a is a solenoid valve that alternately switches an air pressure to an upper or a lower limit port in the air cylinder 42 to move the cylinder 42 up or down.

Reference numeral 44 denotes a knuckle joint attached to the tip of the air cylinder 42, 45 is a rotating lever, 46a and 46b are rotating shafts, and 47 is a rotor. When the air cylinder 42 moves up and down, the rotor 47 is rotated around the rotating shafts 46a and 46b via the knuckle joint 44 and the rotating lever 45.

Reference numerals 48a, 48b, 48c, and 48d indicate rotation bearing bodies, 49a and 49b are rotating shafts, 50a is a left holder, and 50b is a right holder. The left and right holders 50a and 50b are fixed to the rotating shafts 49a and 49b, respectively.

Reference numerals 51a and 51b designate left and right squeegee holders that fix the squeegees 26a and 26b, respectively. The left and right holders 50a and 50b fix the left and right squeegee holders 51a and 51b by means of the tightening of threaded controls 52a and 52b.

The squeegees 26a and 26b are alternately switched when the air cylinder 42 moves up and down, and the solenoid valve 43a is controlled so that the left squeegee 26a is lowered during left-to-right printing, while the right squeegee 26b is lowered during right-to-left printing.

Reference numerals 53a and 53b denote angle detectors fixed to the rear of the rotating shafts 49a and 49b, respectively. An angle adjustment control 54 is located in front of the rotating shafts 49a and 49b, and is rotated via a worm 55 and a worm wheel 56 to vary the attack angles of the left and right squeegees 26a and 26b relative to the screen 23. Reference numerals 57a and 57b denote locks that lock the squeegees after their attack angles have been varied.

When the electropneumatic regulator 29 operating as the means for controlling a weight canceling force is used to supply an air pressure P slightly exceeding the weight of the components suspended from the air cylinder 27 to the air cylinder 27 operating as the elevation drive means for controlling a squeegee weight canceling force, the left and right squeegees 26a and 26b are elevated with the weight of the components canceled. The detection sensor 58 then detects the upper limit position of elevation.

When the electropneumatic regulators 39 and 40 are used to supply air pressures to the front and rear air cylinders 35 and 36 each operating as the elevation drive means for controlling a squeegee-pressing force, the left and right squeegees 26a and 26b are lowered.

When the left and right squeegees 26a and 26b are then pressed against the circuit board 24 via the screen 23, they can be abutted on the screen 23 and the circuit board 24 in such a way as to fit their slope, swell, and warp (the front and rear pressing forces during abutting are determined by the air pressures from the electropneumatic regulators 39 and 40).

In this case, the center of gravity of the components suspended from the air cylinder 27 is located in either front or rear of the bearing 30 to tilt the squeegees forward or backward unless the components are perfectly balanced around the bearing 30. Accordingly, the air pressure from one of the electropneumatic regulators 39 and 40 is set higher than that from the other in advance to make the tips of the left and right squeegees 26a and 26b horizontal. This difference in air pressure is referred to as an offset pressure value (the front offset pressure value of the left squeegee is defined as f(L), the rear offset pressure value of the left squeegee is defined as r(L), the front offset pressure value of the right squeegee is defined as f(R), and the rear offset pressure value of the right squeegee is defined as r(R)).

Thus, the air pressures from the electropneumatic regulators 39 and 40 that are supplied to the air cylinders 35 and 36 are expressed as total air pressures with the addition of a front and a rear offset pressure values (f) and (r), as shown in the following equations.

The front total air pressure on the left squeegee is LF=PF(L)+f(L);

The rear total air pressure on the left squeegee is LR=PR(L)+r(L);

The front total air pressure on the right squeegee is RF=PF(R)+f(R); and

The rear total air pressure on the left squeegee is RR=PR(R)+r(R).

The printing pressure balance between the front and rear of the squeegee is determined by the total air pressures LF, LR, RF, and RP.

When the total air pressures from the electropneumatic regulators 39 and 40 are controlled to zero, the left and right squeegees 26a and 26b are elevated due to the air pressure P from the air cylinder 27 corresponding to the weight of the components.

Reference numerals 59a and 59b designate holding means for positioning at arbitrary positions the left and right squeegees 26a and 26b that are elevated and lowered by the air cylinder 27 operating as the elevation drive means for controlling a squeegee weight canceling force, the front air cylinder 35 operating as the elevation drive means for controlling a squeegee-pressing force, the rear air cylinder 36 operating as the elevation drive means for controlling a squeegee-pressing force. The holding means are composed of locking air cylinders.

Solenoid valves 43b and 43c are used for switching to supply air pressures to the ports in the locking air cylinders 59a and 59b in order to lock and unlock the piston rods 37a and 37b.

Reference numeral 60 indicates a stepping motor operating as a means for driving the elevation of the squeegee head. The stepping motor elevates and lowers the entire print head section 21 (including the air cylinders 35 and 36 operating as the elevation drive means for controlling a squeegee-pressing force, the air cylinder 27 operating as the elevation drive means for controlling a squeegee weight canceling force, the air cylinders 59a and 59b operating as the holding means, the bearing 30 operating as the rotation supporting section, and the left and right squeegees 26a and 26b) in the vertical direction relative to the screen 23 together with the left and right squeegees 26a and 26b. The downward press-in stroke from a position at which the tips of the left and right squeegees 26a and 26b contact the top surface of the screen 23 is controlled by a controller (not shown) for the stepping controller 60.

Reference numerals 61a and 61b denote means for detecting the positions of the press-in origins of the left and right squeegees 26a and 26b when they are abutted on the top surface of the screen 23 in a balanced manner. These means are composed of detection sensors (proximity sensors).

The detection sensors 61a and 61b detect the positions of the piston rods in the air cylinders 35 and 36 that are slightly elevated from their lower limit positions when the left and right squeegees 26a and 26b receive a reaction force from the screen 23 (in this case, the piston rods may be elevated at a distance between 0.1 and 5 mm, but when the hardness of the rubber in the squeegees 26a and 26b is 90 Hs, this distance is preferably set between 0.1 and 1.5 mm in order to minimize the deformation of the tips of the squeegees to allow them to flexibly fit the slope, swell, and warp of the circuit board 24).

The controller (not shown) for the stepping motor 60 that controls positioning lowers the entire print head section 21, and stores a lowering stroke value detected by both detection sensors 61a and 61b, as the positions of the squeegee press-in origins of the left and right squeegees 26a and 26b.

Reference numeral 62 designates a weight measuring means for automatically measuring the weight of the components suspended from the air cylinder 27 and including the left and right squeegees 26a and 26b. The weight measuring means is configured as a controller with the electropneumatic regulator 29.

The controller 62 instructs the air pressure from the electropneumatic regulator 29 to be gradually increased while gradually elevating the left and right squeegees 26a and 26b, and stops the air pressure when the detection sensor 58 detects the elevation limit position.

The air pressure value P obtained at this point is stored in the controller 62 as a weight measured value, that is, a squeegee weight canceling pressure value W.

The print head section 21 having the specified-pressure floating control means is composed of the components shown above.

The operation of the screen printing apparatus and method configured as described above is described below.

First, the squeegee weight canceling pressure value is determined during the setting of printing conditions for the print head section 21. The flow of this operation and its effects are explained with reference to the operational flowchart shown in FIG. 4.

Figure 4:
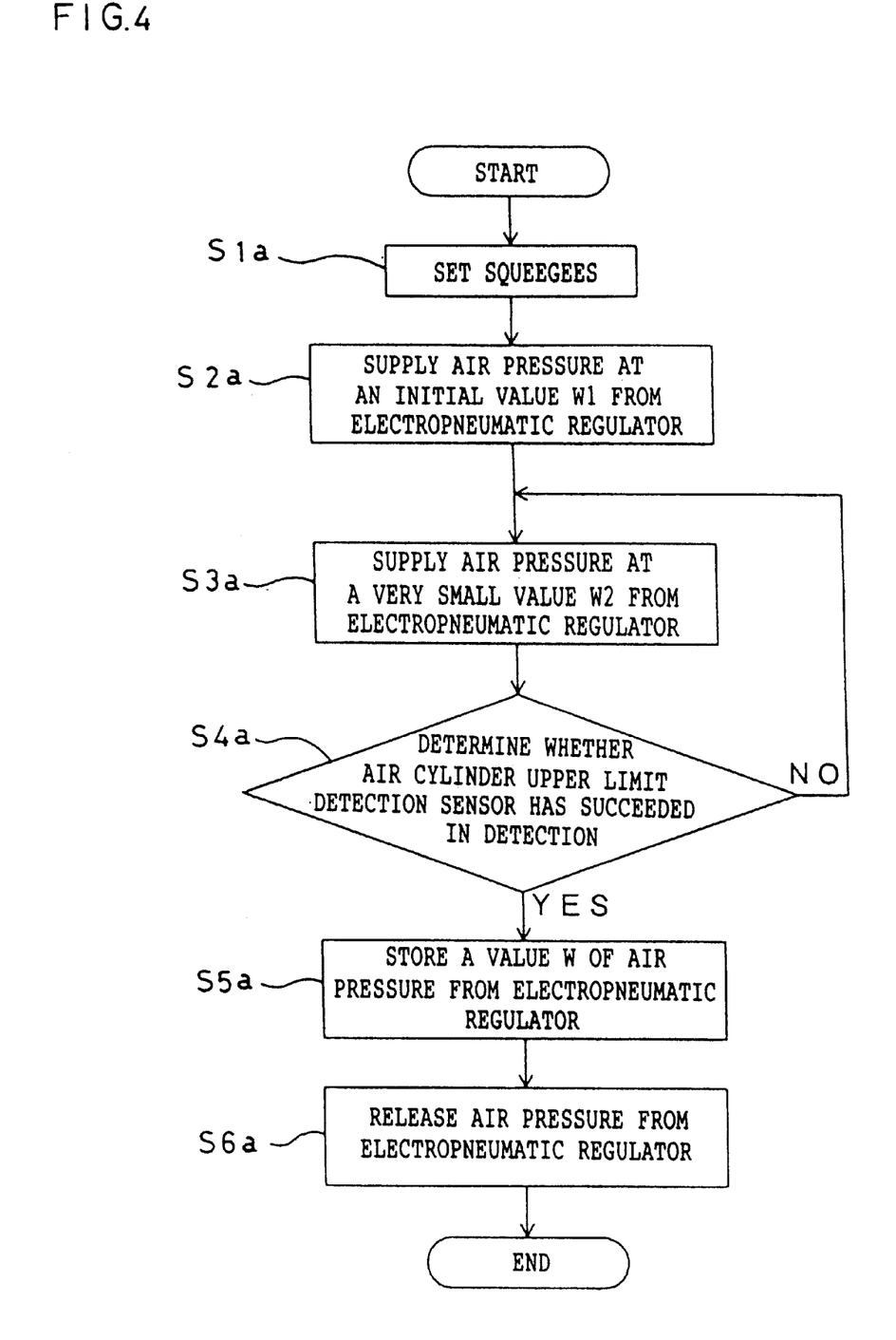
FIG. 4 is a flowchart showing an operation of determining the squeegee weight canceling pressure value during the setting of printing conditions for the print head section.

At step S1a, the left and right squeegees 26a and 26b are set in the holders 50a and 50b.

At step S2a, in response to an instruction from the controller 62, the electropneumatic regulator 29 supplies an air pressure at an initial value w1 (w1<W) to the air cylinder 27. This operation is performed to supply an air pressure lower than that corresponding to the weight W of the components in order to reduce the working time.

At step S3a, in response to an instruction from the controller 62, the electropneumatic regulator 29 supplies an air pressure at a very small value w2 to the air cylinder 27. This operation is performed to improve the accuracy in measuring the squeegee weight canceling pressure value. Thus, the very small value w2 is preferably 0.001 MPa or less, and more preferably, 0.0001 MPa or less. At step S4a, the detection sensor 58 detects and determines whether the piston rod 28 in the air cylinder 27 has elevated up to its upper limit position. If the result of the determination is negative, the process returns to step S3a to repeat the same operation N times until the result becomes positive.

At step S5a, the supply of the air pressure at the very small value w2 to the air cylinder 27 is stopped, and the air pressure value P (P=w1+w2×N) obtained at this point is fed back to the controller 62 for storage. The stored air pressure value P is used as the squeegee weight canceling pressure value W (W=P).

At step S6a, the air pressure P is released (P=0 (zero)) to lower the air cylinder 27.

Using the operational flow from step S1a to step S6a shown above, the squeegee weight canceling pressure value can be automatically determined during the setting of printing conditions for the print head section without relying on a skilled operator. This enables the squeegee weight canceling pressure value to be determined simply, efficiently, promptly, accurately, and reliably.

As a second determination operation, the positions of the squeegee press-in stroke origins are determined and the parallelism between the screen and the squeegees is adjusted, during the setting of printing conditions for the print head section. The flow of this operation and its effects are explained with reference to the operational flowchart shown in FIG. 5.

Figure 5:
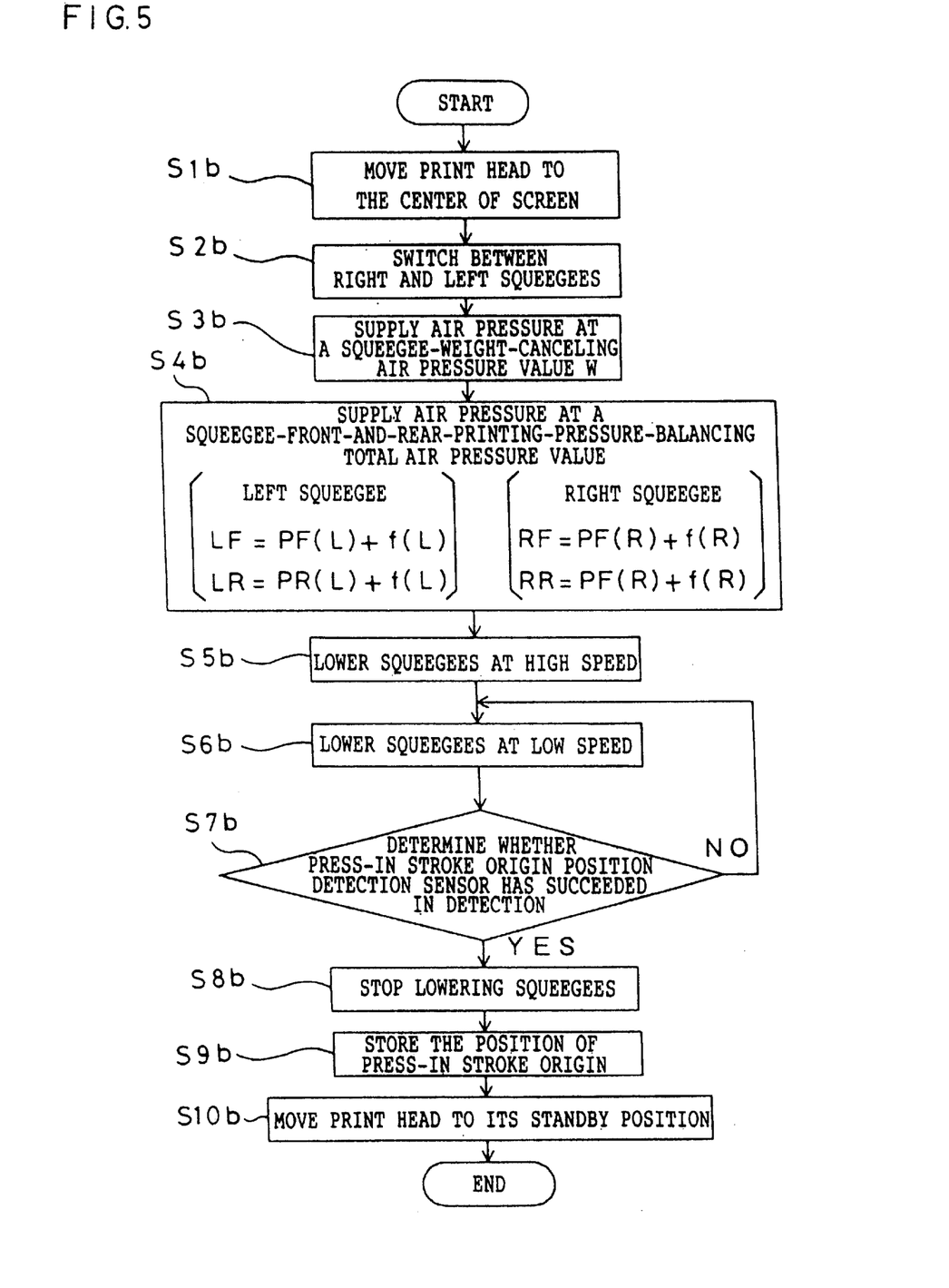
FIG. 5 is a flowchart showing an operation of determining the squeegee press-in stroke origin and an operation for determining the parallelism between a screen and a squeegee, during the setting of printing conditions for the print head section.

This operational flow must be executed after the squeegee weight canceling pressure value has been determined.

First, the right squeegee 26b is checked.

At step S1b, the print head section 21 is horizontally moved to the neighborhood of the center of the screen 23.

At step S2b, to switch the right and left squeegees, the air cylinder 42 is used to tilt the right squeegee 26b toward the screen 23 (to check the left squeegee 26a, this squeegee is tilted).

Figure 7A:
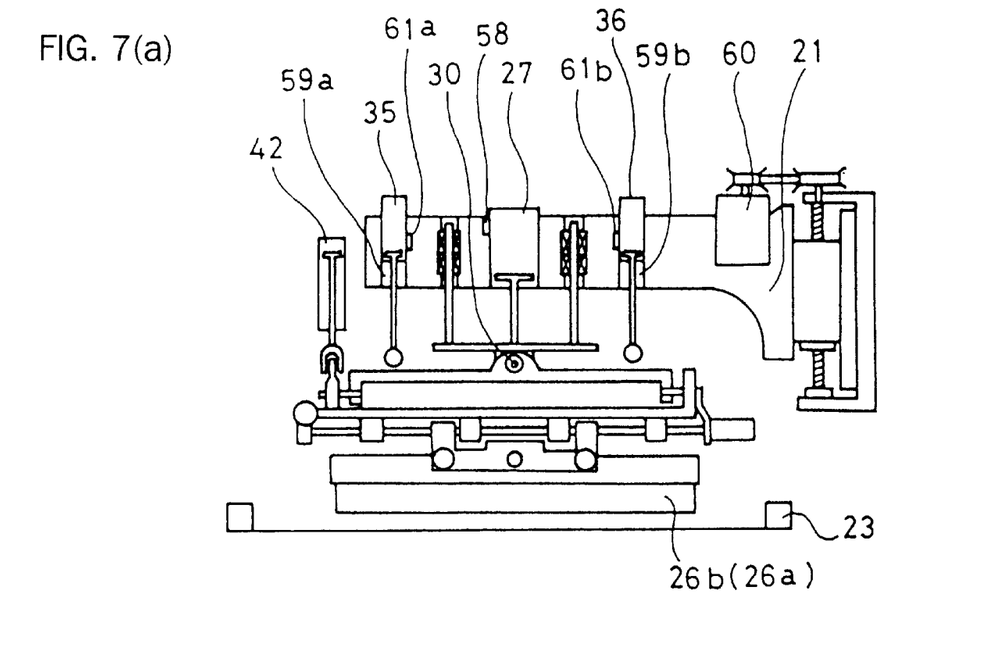
FIGS. 7(a) and (b) are schematic right side views showing the operational state of the print head section.
Figure 7B:
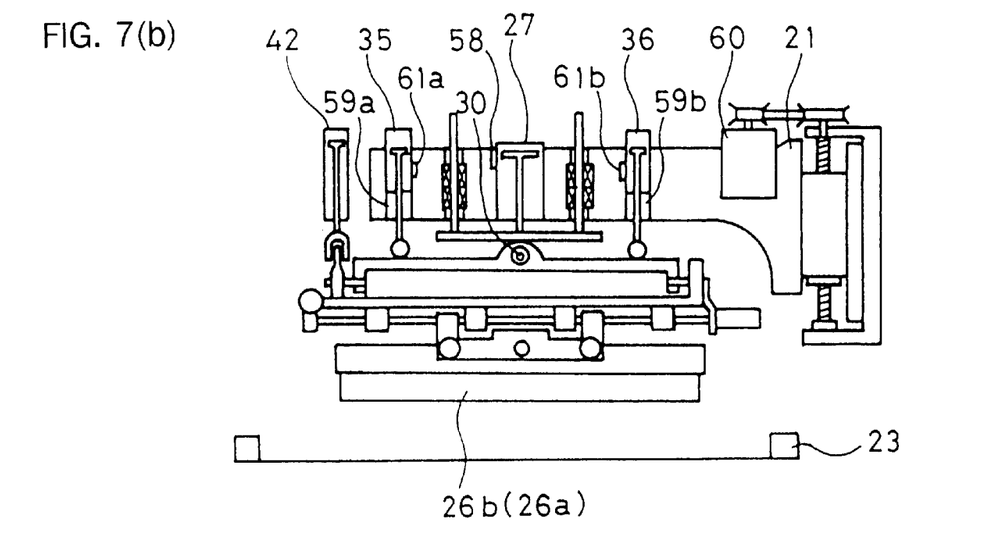

At step S3b, in response to an instruction from the controller 62, an air pressure W from the electropneumatic regulator 29 is supplied to the air cylinder 27 to elevate the left and right squeegees 26a and 26b including their components suspended from the air cylinder 27 in order to cancel the weight of the squeegees (the state in FIG. 7(a) is changed to the state in FIG. 7(b)).

At step S4b, to balance the front and rear squeegee printing pressures, the electropneumatic regulators 39 and 40 supply total air pressures to the air cylinders 35 and 36 (for the left squeegee 26a, the air pressures LF and LR are supplied to the front and the rear, respectively, while for the right squeegee 26b, the air pressures RF and RR are supplied to the front and the rear) to lower the left and right squeegees 26a and 26b including their components suspended from the air cylinder 27 while the right squeegee 26b faces the screen 23. In this state, the right squeegee 26b does not contact the top surface of the screen 23 (the state in FIG. 7(b) is changed to the state in FIG. 8(a)).

Figure 8A:
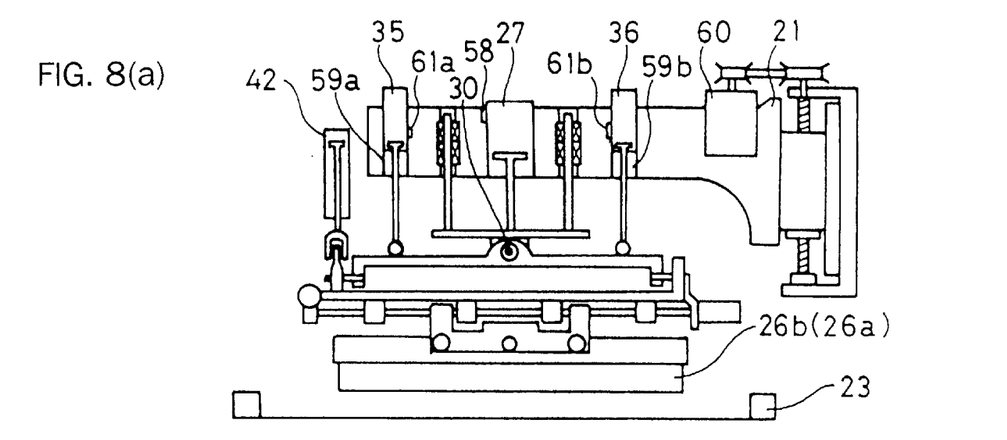
FIGS. 8(a) to (c) are schematic right side views showing the operational state of the print head section.
Figure 8B:
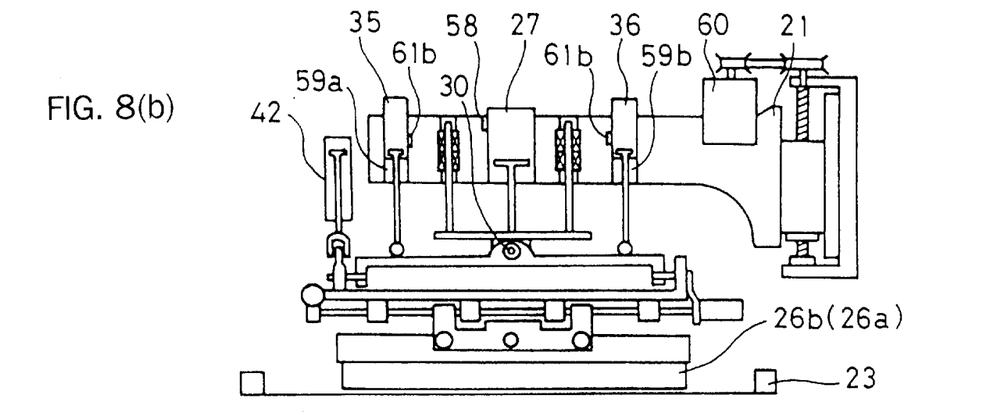

At step S5b, in response to an instruction from the positioning controller (not shown), the stepping motor 60 is driven to lower the entire print head section 21 and the right squeegee 26b down to the neighborhood of the top surface of the screen 23 at a high speed. In this state, the right squeegee 26b does not contact the top surface of the screen 23 (the state in FIG. 8(a) is changed to the state in FIG. 8(b)).

At step S6b, the entire print head section 21 is lowered at a low speed. In this case, the right squeegee 26b gradually fits the tilted shape of the top surface of the screen 23.

At step S7b, it is checked whether both detection sensors 61a and 61b have detected the position of the squeegee press-in origin, and if not, step S6b is repeated.

Figure 8C:
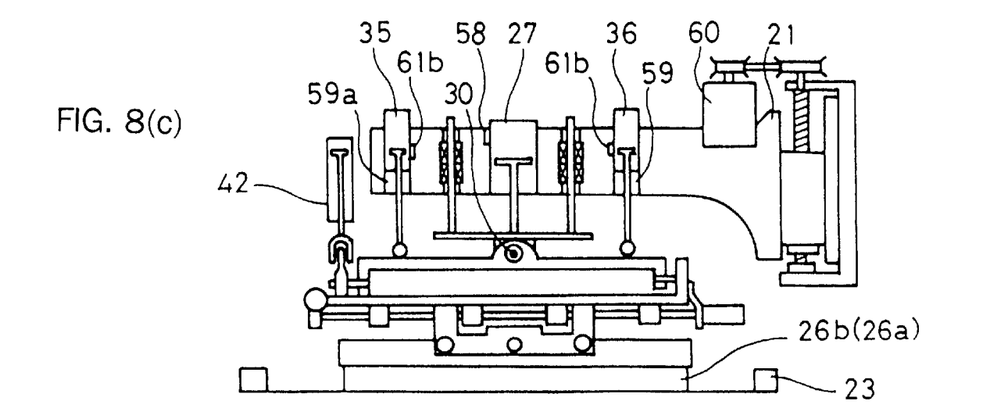

At step S8b, after both detection sensors 61a and 61b have succeeded in detection, lowering of the entire print head section 21 at a low speed is stopped (the state in FIG. 8(c) is entered).

At step S9b, the positioning controller (not shown) automatically registers as the position of the squeegee press-in origin of the right squeegee 26b the lowering stroke value detected by both detection sensors 61a and 61b (the position of the squeegee press-in origin of the left squeegee 26a when the left squeegee 26a is checked).

At step S10b, the entire print head section 21 is elevated (the state in FIG. 7(b)) and then moved in the horizontal direction to its standby position.

Next, the left squeegee 26a is checked as in the right squeegee 26b.

Using the operational flow from step S1b to step S10b shown above, the positions of the squeegee press-in stroke origins are determined and the parallelism between the screen and the squeegees is adjusted, during the setting of printing conditions for the print head section. Thus, these operations can be automatically performed without relying on a skilled operator, so they can be performed simply, promptly, accurately, and reliably and exhibit a high reproducibility.

A continuous printing operation is started after the pre-printing determination operations have been finished. The continuous printing operation performed by the print head section 21 and its effects are explained with reference to the operational flowchart shown in FIG. 6.

Figure 6:
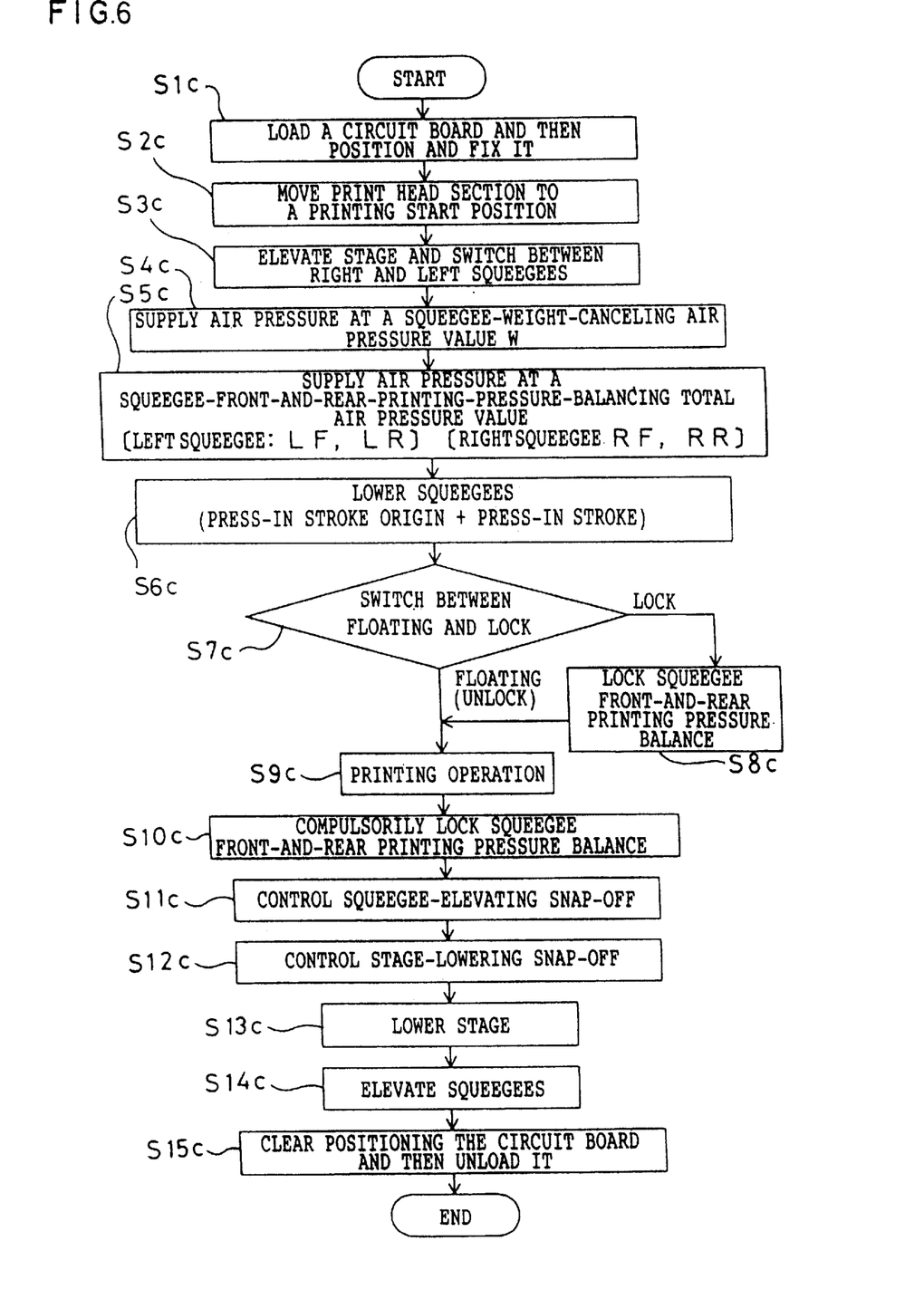
FIG. 6 is a flowchart showing a continuous printing operation of the print head section.

First, at step S1c, the circuit board 24 is loaded on the stage 25 and positioned and fixed.

At step S2c, the print head section 21 is moved to a printing start position on the screen 23 (a position outside the left end surface of the left squeegee 26a for left-to-right printing or a position outside the right end surface of the right squeegee 26b for right-to-left printing).

At step S3c, the stage 25 is elevated until the top surface of the circuit board 24 is lowered to the neighborhood of the bottom surface of the screen 23, and then the switching operation between the left and right squeegees allows the air cylinder 42 to lower the right squeegee 26b on the screen 23 (for printing from left to right, the left squeegee 26a is lowered).

At step S4c, to cancel the weight of the squeegees, the controller 62 supplies an air pressure W to elevate the left and right squeegees 26a and 26b including their components (the state in FIG. 7(a) is changed to the state in FIG. 7(b)).

At step S5c, to balance the front and rear squeegee printing pressures, total air pressures are supplied to lower the left and right squeegees 26a and 26b including their components (the state in FIG. 7(b) is changed to the state in FIG. 8(a)).

At step S6c, the entire print head section 21 is lowered from its elevated standby position down to the position of the squeegee press-in origin over a distance corresponding to a press-in stroke that has been previously preset and input.

At step S7c, a check is conducted to switch between floating printing and locked printing. It must be determined during a pre-determination operation prior to printing whether floating or locked printing is used.

For locked printing, the process transfers to the operation in step S8c, whereas for floating printing, the process passes to the operation in step S9c with the tips of the piston rods 37a and 37b in the air cylinders 35 and 36 remaining unlocked.

Floating operation is suitable for balanced low-specified-pressure printing executed by flexibly fitting the squeegees on the slope, swell, and warp of the circuit board 23 without being affected by them (such motions of the squeegees 26a and 26b are called "floating").

During a printing operation, the squeegees 26a and 26b are floated in this manner to improve the stability and reliability of the amount of printing paste and printed shapes when the printing paste 22 is filled in the printing opening in the screen 23 using the squeegees 26a and 26b, thereby ensuring that the paste 22 is filled in the printing opening pattern in the screen 23.

Locked printing is suitable for more viscous printing paste 22. In this case, with the settings for floating printing, the low printing pressure causes the printing paste to effect a strong rolling reaction force during printing, resulting in the likelihood that the squeegees 26a and 26b repeat sinking and floating. This leads to an unbalanced printing pressure and thus a reduced printing accuracy. Thus, if the printing paste 22 is very viscous, locked printing can be used to reliably fill the printing paste 22 in the printing opening pattern in the screen 23. During locked printing, the tips of the piston rods 37a and 37b in the air cylinders 35 and 36 are locked at step S8c and the process transfers to step S9c.

At step S9c, a printing operation is performed. If the right squeegee 26b has lowered, the printing operation is performed from right to left (if the left squeegee 26b has lowered, the printing operation is performed from left to right).

At step S10c, after the printing operation has been finished and before the squeegees 26a and 26b are snapped off, the tips of the piston rods 37a and 37b in the air cylinders 35 and 36 are locked.

During locked printing, the existing locked state may be maintained, while during floating printing, the rods are compulsorily locked. This compulsory lock allows the rotating, elevating, and lowering operations of the squeegees 26a and 26b to be fixed and held to preclude the squeegees 26a and 26b from applying an unwanted force to the screen 23 during a snapping-off operation, thereby maintaining printed shapes obtained when the printing paste 22 is filled in the printing opening in the screen 23 using the squeegees 26a and 26b.

At step S11c, squeegee-elevating snap-off control is provided. The squeegees 26a and 26b are elevated up to a position at which the amount of pressing force is zero, that is, at which the tips of the squeegees 26a and 26b barely contact the surface of the screen 23, thereby minimizing the deflection of the screen 23 caused when the stage 25 is released from the screen 23. This operation further prevents printed shapes from being disrupted.

At step S12c, stage-lowering snap-off control is provided. By setting at a small value (1 mm/sec. or less) the speed at which the stage is lowered to leave the screen, the adhesion of the printing paste 22 filled in the printing opening in the screen 23 to the side of the printing opening is reduced when the printing paste 22 is applied to the circuit board 24 for printing, in order to reduce the amount of force pulling the screen 23 toward the circuit board 24. Consequently, behavior of the screen 23 can be minimized to prevent printed shapes from being disrupted.

After the snap-off operation has been finished, the stage 25 is lowered at a high speed at step S13c, and the squeegees 26a and 26b are elevated at step S14c. Subsequently, at step S15c, the positioning and fixation of the circuit board 24 are cleared to allow the circuit board 24 to be transferred.

The printing operation from step S1c to step S15c described above is repeated to achieve continuous printing.

What is claimed is:

1. A screen printing apparatus, comprising:
    a screen with a plurality of opening holes therein forming a printing pattern,
    a squeegee for rotationally oscillating in a vertical direction around a specified longitudinal position, and that can be contacted with and pressed into said screen,
    a horizontal movement means for moving said squeegee in an approximately horizontal direction relative to said screen, said squeegee being contacted with and pressed into said screen and moved in the horizontal direction while printing paste on said screen is applied to a circuit board through the opening holes in said screen for printing, control means being operable:
  i) when the printing paste on said screen is printed and applied, for applying a force sufficient to cancel a weight of the squeegee in an elevating direction to elevate the squeegee, and for then applying a force to said squeegee to push it down in a lowering direction from respective longitudinal sides of said rotational center to contact said screen in a way to be pressed into said screen, and
  ii) when said squeegee is moved in the approximately horizontal direction relative to said screen, for adjustably rotationally oscillating, and elevating and lowering said squeegee due to one or more of slope, swell, and warp conditions of said circuit board present in the approximately horizontal movement direction and length direction of said squeegee to fit said squeegee on the circuit board, so that said squeegee presses said screen into said circuit board while effecting a specified pressure flexibly of said squeegee fitting the circuit board.

2. A screen printing apparatus according to claim 1, wherein said control means comprises means for selecting and applying a specified force to float said squeegee over said circuit board in response to one or more of the slope, swell and warp conditions thereof.

3. A screen printing method for contacting and pressing a squeegee that can be rotationally moved within a vertical plane around a specified longitudinal position, with and into a screen in which opening holes are formed in a printing pattern, and moving the squeegee in an approximately horizontal direction to apply printing paste on said screen to a circuit board through the opening holes in said screen for printing, wherein when said squeegee is moved in the approximately horizontal direction relative to the screen to fill the printing paste in the opening holes in said screen arranged in the printing pattern, the method comprises the steps of:
  applying a force sufficient to cancel the weight of said squeegee in the elevating direction to elevate the squeegee;
  then applying a force to said squeegee to push it down in the lowering direction from the respective longitudinal sides of a rotational center to contact it with said screen in such a way that it can be pressed into the screen; and
when said squeegee is moved in the approximately horizontal direction relative to said screen, rotationally oscillating, and elevating and lowering said squeegee in such a way that said squeegee fits the slope, swell, and warp of the circuit board present in the approximately horizontal direction and a length direction of said squeegee, so that said squeegee presses said screen into said circuit board while effecting a specified pressure; and
after said printing paste has been filled in the opening holes in said screen arranged in a printing pattern, the method comprises the steps of:
  before releasing said circuit board from the screen, fixing said squeegee in such a way that it will not operate in the rotational oscillating direction or elevating direction; and
  after such fixation, elevating said squeegee up to a position at which the amount of pressing-in of said squeegee relative to said screen surface is zero.

4. A screen printing apparatus, comprising:
a screen with a plurality of opening holes therein forming a printing pattern,
a squeegee that can be rotationally oscillated in a vertical direction around a specified longitudinal position and that can be contacted with and pressed into said screen,
horizontal movement means for moving said squeegee in an approximately horizontal direction relative to said screen, said squeegee being contacted with and pressed into said screen and moved in the horizontal direction while printing paste on said screen is applied to a circuit board through the opening holes in said screen for printing,
press-in means for applying a force sufficient to elevate the squeegee in an elevating direction in such a way as to cancel the weight of said squeegee and for then applying a force sufficient to press said squeegee down in the lowering direction from both longitudinal sides of said rotational center, so that the squeegee is contacted and pressed with and into said screen; and
holding means that is operative, after the press-in means has pressed said squeegee into said screen and before said squeegee is moved in the approximately horizontal direction relative to said screen, for holding said squeegee in such a way that it will not operate in the rotational oscillating direction or elevating direction.

5. A screen printing apparatus comprising:
a screen comprising a plurality of opening holes therein forming a printing pattern,
a squeegee that can be rotationally oscillated in a vertical direction around a specified longitudinal position and that can be contacted with and pressed into said screen,
horizontal movement means for moving said squeegee in an approximately horizontal direction relative to said screen, said squeegee being contacted with and pressed into said screen and moved in the horizontal direction while printing paste on said screen is applied to a circuit board through the opening holes in said screen for printing,
first elevation drive means for controlling a squeegee weight canceling force which can elevate and lower the squeegee in the vertical direction relative to said screen and including a squeegee weight canceling force control means for elevating said squeegee using a weight canceling force including the weight of said squeegee and components operating together with said squeegee;
a rotation supporting section provided at the tip of said first elevation drive means to support said squeegee at a specified longitudinal position in such a way that said squeegee can be rotationally oscillated;
a pair of second elevation drive means for controlling a squeegee-pressing force which applies a downward force to both longitudinal sides of a rotational center supported by said rotation supporting section in order to lower said squeegee, that has been elevated by said first elevation drive means, the second elevation drive means including control means for arbitrarily automatically controlling the pressing force of said squeegee to be applied to said screen and said circuit board;
holding means for positioning and holding at an arbitrary position said squeegee elevated by said second elevation drive means and said first elevation drive means; and
squeegee head elevation drive means for elevating and lowering said squeegee in the vertical direction relative to said screen using said second elevation drive means, said first elevation drive means, said holding means, and said rotation supporting section.

6. A screen printing apparatus according to claim 5, wherein said first elevation drive means includes weight measuring means for automatically measuring the weight of the squeegee, the weight measuring means gradually increasing air pressure from a regulator and determining such air pressure as a measured weight value that is measured when said squeegee has been elevated up to the upper limit position of said elevation drive means.

7. A screen printing apparatus according to claim 5, further including a pair of detection means for detecting an origin position wherein the squeegee abuts the top surface of the screen in a balanced manner, said detection means detecting the origin position to lower said squeegee that has been elevated by said first elevation drive means and said second elevation drive means, to gradually lower the squeegee by the squeegee head elevation drive means such that the squeegee fits said screen around said rotation supporting section in a balanced manner, and to detect, as the position of said squeegee press-in origin, the position of the squeegee elevated due to a force from said screen when said pair of second elevation drive means has elevated the same distance from its lower limit position.

8. A screen printing method for contacting and pressing a squeegee that can be rotationally moved within a vertical plane around a specified longitudinal position, with and into a screen comprising a plurality of opening holes forming a printing pattern, and moving the squeegee in a horizontal direction to apply printing paste on said screen to a circuit board through the opening holes in said screen for printing, the method comprising:

an automatic measuring step for automatically measuring a weight of said squeegee and components moving together with said squeegee;

an elevating step operative after said automatic measuring step for elevating said squeegee using said automatically measured weight;

a press-in step operative after said elevating step for applying an arbitrary pressing force to the squeegee from both sides of a rotational center to lower and press the squeegee against said screen or said circuit board; and a squeegee press-in origin position detection step operative after the press-in step for determining, as the position of said squeegee press-in origins the position of said squeegee obtained when the squeegee has been elevated due to a force from said screen or said circuit board, for a distance corresponding to an arbitrarily set elevation.

\* \* \* \* \*